(12) United States Patent
Dong et al.

(10) Patent No.: US 9,704,557 B2
(45) Date of Patent: Jul. 11, 2017

(54) METHOD AND APPARATUS FOR STORING RETENTION TIME PROFILE INFORMATION BASED ON RETENTION TIME AND TEMPERATURE

(71) Applicant: QUALCOMM Incorporated, San Diego, CA (US)

(72) Inventors: Xiangyu Dong, San Diego, CA (US); Jung Pill Kim, San Diego, CA (US); Deepti Vijayalakshmi Sriramagiri, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/220,862

(22) Filed: Mar. 20, 2014

(65) Prior Publication Data

US 2015/0085594 A1 Mar. 26, 2015

Related U.S. Application Data

(60) Provisional application No. 61/882,490, filed on Sep. 25, 2013.

(51) Int. Cl.
| | | |
|---|---|---|
| G11C 11/402 | (2006.01) | |
| G11C 11/406 | (2006.01) | |
| G06F 13/16 | (2006.01) | |
| G11C 7/04 | (2006.01) | |

(52) U.S. Cl.
CPC .... *G11C 11/40626* (2013.01); *G06F 13/1668* (2013.01); *G11C 7/04* (2013.01); *G11C 11/406* (2013.01); *G11C 11/40611* (2013.01); *G11C 2211/4068* (2013.01); *Y02B 60/1228* (2013.01)

(58) Field of Classification Search
CPC . G11C 11/4023; G11C 11/403; G11C 11/406; G11C 11/40611; G11C 11/40626
USPC .......................................... 365/222, 149, 211
See application file for complete search history.

(56) References Cited

U.S. PATENT DOCUMENTS

| | | | | |
|---|---|---|---|---|
| 6,038,187 | A * | 3/2000 | El Hajji | ................ G11C 11/406 365/189.04 |
| 7,057,961 | B2 | 6/2006 | Perner | |
| 7,177,220 | B2 | 2/2007 | Chou et al. | |
| 7,522,464 | B2 | 4/2009 | Yoo et al. | |
| 8,982,653 | B2 * | 3/2015 | Nurminen | ................ G11C 7/04 365/211 |
| 2003/0156483 | A1 | 8/2003 | Feurle et al. | |
| 2007/0030746 | A1 | 2/2007 | Best et al. | |
| 2008/0082290 | A1 | 4/2008 | Jeong et al. | |
| 2013/0279283 | A1 | 10/2013 | Seo et al. | |

OTHER PUBLICATIONS

Liu, J. et al., "An experimental study of data retention behavior in modern DRAM devices: implications for retention time profiling mechanisms", Proceedings of the 40th Annual International Symposium on Computer Architecture, 2013, pp. 60-71.
International Search Report and Written Opinion—PCT/US2014/056001—ISA/EPO—Jul. 7, 2015.

* cited by examiner

*Primary Examiner* — Andrew Q Tran
(74) *Attorney, Agent, or Firm* — Toler Law Group, PC

(57) ABSTRACT

Memory devices may send information related to refresh rates to a memory controller. The memory controller may instruct the memory devices to refresh based on the received information.

5 Claims, 7 Drawing Sheets

METHOD AND APPARATUS FOR STORING RETENTION TIME PROFILE INFORMATION BASED ON RETENTION TIME AND TEMPERATURE

I. CLAIM OF PRIORITY

The present application claims priority from U.S. Provisional Application No. 61/882,490, filed Sep. 25, 2013, which is entitled "METHOD AND APPARATUS FOR REFRESHING A MEMORY CELL," the content of which is incorporated by reference in its entirety.

II. FIELD

The present disclosure is generally related to memory devices.

III. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player.

Wireless telephones may include volatile memory devices that include memory cells that are periodically refreshed to maintain data integrity. The volatile memory devices may "self-refresh" the memory cells using internal circuitry; however, the self-refresh process may cause different memory devices to be unavailable for access at different times due to each memory device refreshing according to its own schedule. Alternatively, a memory controller may control refreshing of the memory cells using an "auto-refresh" process. However, the auto-refresh process may disregard specific characteristics (e.g., temperature) of the volatile memory devices. To insure data integrity, the auto-refresh process may refresh the memory cells based on an industry standard that yields a large guard band (e.g., time interval between the actual refresh process and a refresh process based on the temperature of the volatile memory devices) which may increase power consumption as memory devices are refreshed more frequency than needed.

IV. SUMMARY

Apparatuses and methods for refreshing a memory cell are disclosed. Volatile memory devices (e.g., dynamic random access memory (DRAM) devices) may include mode registers to store retention profile information of the volatile memory devices. The retention profile information may correspond to a refresh rate for memory cells within the volatile memory devices based on temperatures of the volatile memory devices. A memory controller may access the retention profile information from the mode registers and generate refresh commands based on the refresh rates. For example, the memory controller may designate the volatile memory device having the fastest refresh rate as the "master" device and designate the remaining volatile memory devices as "slave" devices. The memory controller may send refresh commands to the master device and to the slave devices based on the refresh rate of the master device. The memory cells may be refreshed in response to receiving a refresh command. In other implementations, the volatile memory devices may use one or more sideband channels to communicate pulses (representative of the refresh rate) based on temperatures of the volatile memory devices to the memory controller. The memory controller may determine which volatile memory device has a pulse rate that is greater than the pulse rate of the other volatile memory devices and designate the determined volatile memory device as the master device.

In a particular embodiment, an apparatus includes a memory device including dedicated data storage to store retention time profile information of the memory device. The retention time profile information in the dedicated data storage is accessible to a memory controller via a data bus.

In another particular embodiment, an apparatus includes a memory controller configured to read retention time profile information from dedicated data storage of a memory device. The memory controller is also configured to generate refresh commands at a rate based at least partially on the retention time profile information. The memory controller is further configured to send the refresh commands to the memory device via a command bus. The refresh commands instruct the memory device to refresh memory cells.

In another particular embodiment, a method includes storing retention time profile information at dedicated data storage of a memory device. The method further includes receiving refresh commands from a memory controller. The memory controller sends the refresh commands at a rate based at least partially on the retention time profile information. The method also includes refreshing memory cells within the memory device in response to receiving a refresh command.

In another particular embodiment, a method includes reading, at a memory controller, retention time profile information from dedicated data storage of a memory device. The method also includes generating refresh commands at a rate based at least partially on the retention time profile information. The method further includes sending the refresh commands to the memory device via a command bus. The refresh commands instruct the memory device to refresh memory cells.

In another particular embodiment, an apparatus includes a memory device including a timer configured to send pulses to a memory controller over a sideband channel. The timer sends the pulses at a rate associated with a refresh rate of first memory cells in the memory device.

In another particular embodiment, an apparatus includes a memory controller configured to detect a first rate of first pulses from a first memory device over a first sideband channel. The first rate is associated with a refresh rate of first memory cells in the first memory device. The memory controller is also configured to detect a second rate of second pulses from a second memory device over a second sideband channel. The second rate is associated with a refresh rate of second memory cells in the second memory device. The memory controller is further configured to send refresh commands to the first memory device and to the second memory device at the first rate or at the second rate. The refresh commands instruct the first memory device to refresh the first memory cells. The refresh commands also instruct second memory device to refresh the second memory cells.

In another particular embodiment, a method includes detecting, at a memory controller, a first rate of first pulses from a first memory device over a first sideband channel. The first rate is associated with a refresh rate of first memory cells in the first memory device. The method also includes detecting a second rate of second pulses from a second memory device over a second sideband channel. The second rate is associated with a refresh rate of second memory cells in the second memory device. The method further includes sending refresh commands to the first memory device and to the second memory device at the first rate or at the second rate. The refresh commands instruct the first memory device to refresh the first memory cells. The refresh commands also instruct the second memory device to refresh the second memory cells.

Particular advantages provided by at least one of the disclosed embodiments include an ability to reduce power consumption of volatile memory devices by synchronizing refresh operations for memory cells based on temperature and retention time profile information of the volatile memory devices using a memory controller. Other aspects, advantages, and features of the present disclosure will become apparent after review of the entire application, including the following sections: Brief Description of the Drawings, Detailed Description, and the Claims.

V. BRIEF DESCRIPTION OF THE DRAWINGS

VI. DETAILED DESCRIPTION

Figure 1:
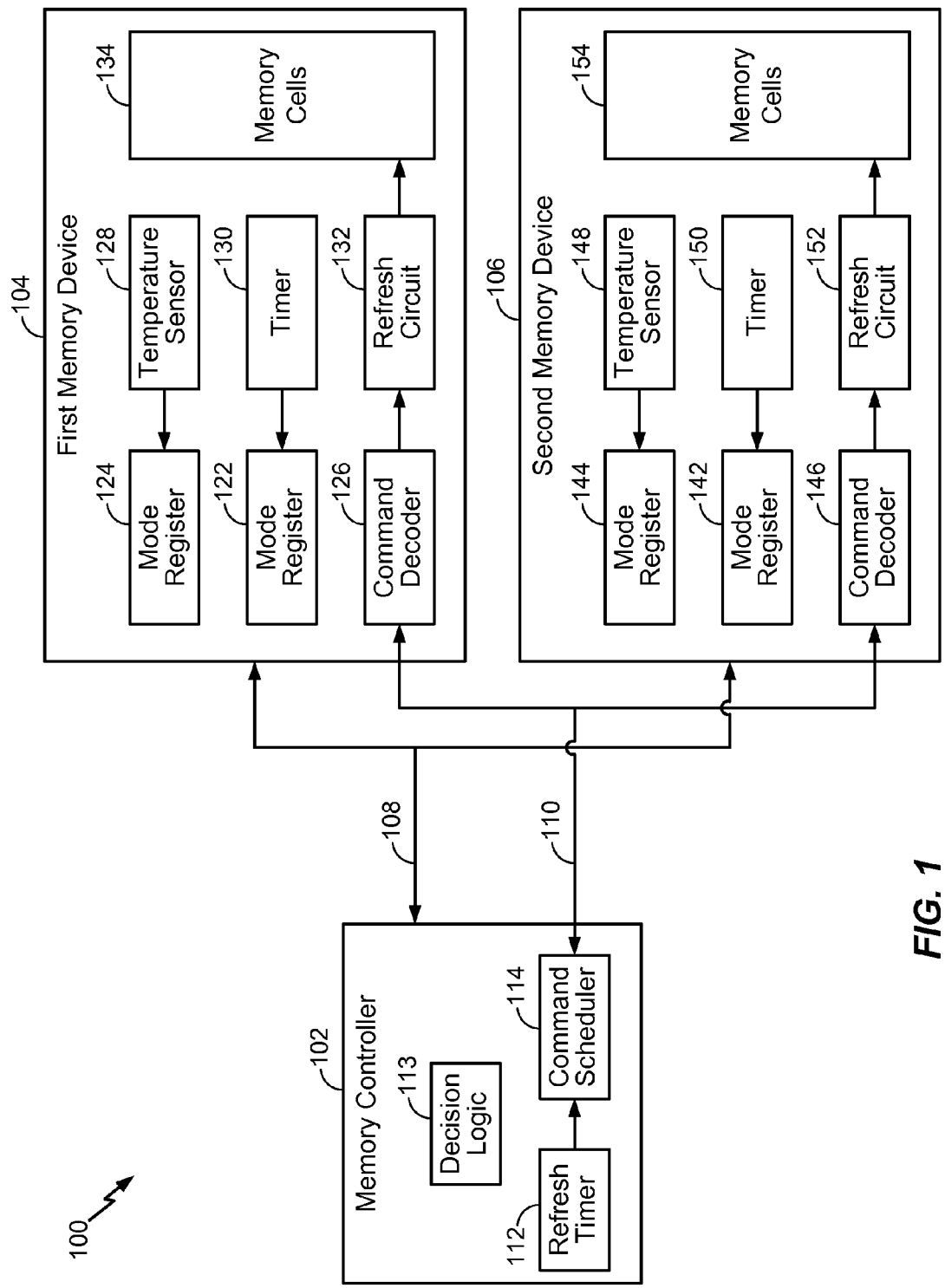
FIG. 1 is a diagram to illustrate a particular embodiment of a system that is operable to refresh a memory cell.

Referring to FIG. 1, a particular embodiment of a system 100 that is operable to refresh a memory cell is shown. The system 100 includes a memory controller 102, a first memory device 104, and a second memory device 106. The first memory device 104 and the second memory device 106 may be volatile memory devices. For example, the first memory device 104 and the second memory device 106 may be dynamic random access memory (DRAM) devices. The memory controller 102 may be coupled to the memory devices 104, 106 via a data bus 108 and via a command bus 110.

The first memory device 104 may include a first plurality of memory cells 134 that store data. In a particular embodiment, the first plurality of memory cells 134 may correspond to DRAM cells. Each memory cell may be refreshed, or re-energized, periodically at a particular rate in order to maintain data integrity. For example, the first plurality of memory cells 134 may be designed based on capacitors that store electrical charges, which may discharge over time. Refreshing is the process of recharging, or re-energizing, the capacitors. The first memory device 104 may also include a first timer 130 that may be configured to generate first retention time profile information of the first memory device 104. The first retention time profile information may include data that indicates a first retention time of the first plurality of memory cells 134 at a particular temperature. For example, the first retention time profile information may include data that corresponds to an amount of time the first plurality of memory cells 134 may maintain data integrity at the particular temperature without being recharged (e.g., refreshed).

The first memory device 104 may also include a first temperature sensor 128. The first temperature sensor 128 may monitor a first temperature of the first memory device 104. The first retention time of the first plurality of memory cells 134 may be based at least on the first temperature of the first memory device 104. For example, the first retention time of the first plurality of memory cells 134 may decrease as the first temperature of the first memory device 104 increases.

The first memory device 104 may also include a first dedicated data storage to store the first retention time profile information. The retention time profile information may indicate a retention time of the first plurality of memory cells 134 at a particular temperature. As a non-limiting example, the retention time profile information may indicate that the first plurality of memory cells 134 may maintain data integrity for 3 milliseconds (e.g., retention time) at a temperature of 75 degrees Fahrenheit. The memory controller 102 may use this retention time profile information to adjust a refresh rate of the first plurality of memory cells 134 in response to a temperature change detected by the temperature sensor 128. In a particular embodiment, the first dedicated data storage may be a first mode register 122. In another particular embodiment, the first dedicated data storage may be a serial presence detect (SPD) chip. As used herein, the term "dedicated data storage" and "mode register" may be used interchangeably. A "mode register" may refer to any chip, device, and/or register configured to store the retention time profile information and/or temperature information. The first timer 130 may be configured to provide the first retention time profile information to the first mode register 122. In addition, or alternatively, the first retention time profile information may correspond to hard-coded data stored in the first mode register 122. In other implementations, the first mode register 122 may include read-only storage elements that store the first retention time profile information. For example, the retention time profile information may be stored by setting magnetic tunnel junction (MTJ) elements of the first mode register 122.

The first memory device 104 may also include a second dedicated data storage to store first temperature information associated with the first memory device 104. In a particular embodiment, the second dedicated data storage may be a second mode register 124. The first temperature sensor 128 may be configured to provide first temperature information to the second mode register 124 and to periodically update the first temperature information based on temperature measurements taken by the first temperature sensor 128.

The second memory device 106 includes a second plurality of memory cells 154, a second timer 150, and a second temperature sensor 148. The second plurality of memory cells 154, the second timer 150, and the second temperature sensor 148 may operate in a substantially similar manner with respect to the second memory device 106 as described with respect to the first plurality of memory cells 134, the first timer 130, and the first temperature sensor 128, respectively. The second memory device 106 also includes a third mode register 142 and a fourth mode register 144. The third mode register 142 may be configured to store second retention time profile information associated with the second plurality of memory cells 154, and the fourth mode register 144 may be configured to store second temperature information associated with the second memory device 106.

In a particular embodiment, the first memory device 104 and the second memory device 106 may be within a common rank of the system 100 and may be accessed in "lockstep." For example, the memory devices 104, 106 may undergo read operations at a common time and may be refreshed at a common time.

The memory controller 102 may include a refresh timer 112 and a command scheduler 114. The memory controller 102 may be configured to access data stored in the mode registers 122, 124, 142, 144 via the data bus 108. In a particular embodiment, the data bus 108 may be a 64-bit bus configured to communicate 16 bits of data from each mode register 122, 124, 142, 144. The memory controller 102 may be configured to read the first retention time profile information from the first mode register 122 and to read the second retention time profile information from the third mode register 142. In a particular embodiment, the memory controller 102 may include a plurality of mode registers to store the first and second retention time profile information.

The memory controller 102 may be configured to read the first and second retention time profile information and the first and second temperature information using a mode register read (MRR) command. In a particular embodiment, decision logic 113 may determine which memory device 104, 106 is the "master" device (e.g., has the shortest retention time associated with the memory cells 134, 154) based on the retention time profile information and the temperature information. For example, the first memory device 104 may be the master device if the first and second retention time profile information and the first and second temperature information indicate that the first retention time of the first plurality of memory cells 134 is shorter than the second retention time of the second plurality of memory cells 154. Alternatively, the second memory device 106 may be the master device if the first and second retention time profile information and the first and second temperature information indicate that the second retention time is shorter than the first retention time.

The memory controller 102 may modify (e.g., adjust) the refresh timer 112 based at least partially on the retention time profile information associated with the master device. For example, the refresh timer 112 may send a signal to the command scheduler 114 to generate a refresh command at a particular rate. If the first memory device 104 is the master device (and the second memory device 106 is a "slave" device), the memory controller 102 may modify the refresh timer 112 to send the signal to the command scheduler 114 at a rate associated with the first retention time. If the second memory device 106 is the master device (and the first memory device 104 is the slave device), the memory controller 102 may modify the refresh timer 112 to send the signal to the command scheduler 114 at a rate associated with the second retention time. The command scheduler 114 may generate refresh commands at the particular rate based on the retention time profile information and temperature information. The command scheduler 114 may transmit the refresh commands to the memory devices 104, 106 via the command bus 110.

A first command decoder 126 of the first memory device 104 may be configured to receive the refresh commands from the command scheduler 114, and a second command decoder 146 of the second memory device 106 may be configured to receive the refresh commands from the command scheduler 114. The first and second command decoders 126, 146 may decode the refresh commands and provide the decoded refresh commands to a first and second refresh circuit 132, 152, respectively. The first refresh circuit 132 may generate a voltage signal to charge capacitors of the first plurality of memory cells 134 in response to receiving the decoded refresh command, and the second refresh circuit 152 may generate a voltage signal to charge capacitors of the second plurality of memory cells 154 in response to receiving the decoded refresh commands. Charging the capacitors refreshes the memory cells 134, 154 to maintain data integrity.

The system 100 of FIG. 1 may incorporate benefits of a self-refresh memory operation with benefits of an auto-refresh operation. For example, the system 100 may improve data throughput at the memory devices 104, 106 by initiating the refresh process at the memory controller 102 (e.g., at the refresh timer 112) to maintain operation of the first memory device 104 and the second memory device 106 in lockstep. The system 100 may also utilize the temperature sensors 128, 148 located on the memory devices 104, 106 to determine a retention time of the memory cells 134, 154. Thus, the retention time may be based on specific characteristics (e.g., temperatures and retention time profile information) of the memory devices 134, 154 and may be longer than a standardized retention time, such as specified by a Joint Electron Device Engineering Council (JEDEC) standard. For example, under typical operating temperatures (e.g., approximately 85 degrees Celsius), the system 100 may reduce an amount of power consumption at the memory devices 104, 106 by approximately fifty percent when compared to a conventional auto-refresh memory operation. Under relatively low operating temperatures (e.g., approximately 25 degrees Celsius), the system 100 may reduce an amount of power consumption at the memory devices 104, 106 by approximately eighty percent when compared to a conventional auto-refresh memory operation.

Figure 2:
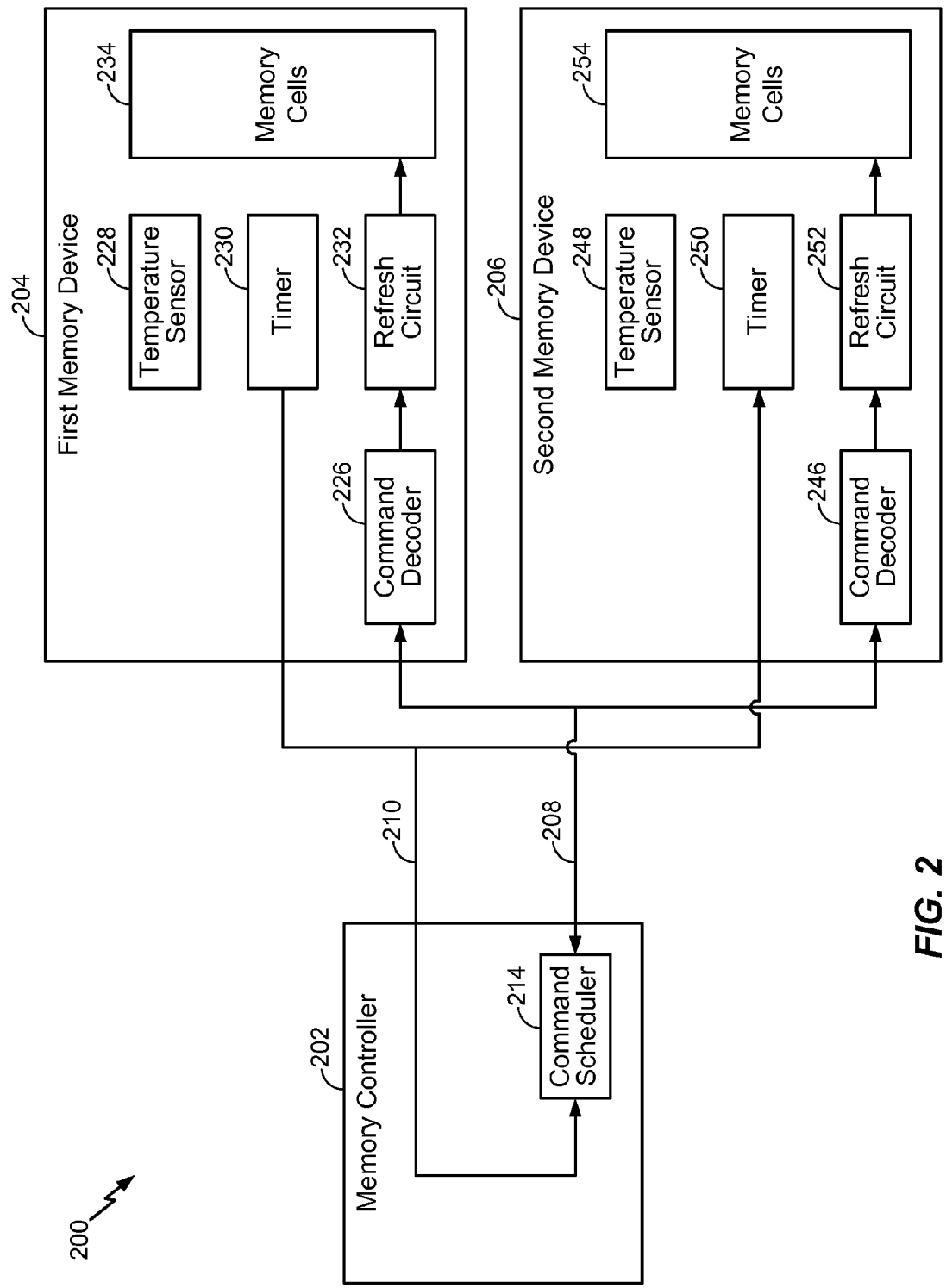
FIG. 2 is a block diagram to illustrate another particular embodiment of a system that is operable to refresh a memory cell.

Referring to FIG. 2, a particular embodiment of a system 200 that is operable to refresh a memory cell is shown. The system 200 includes a memory controller 202, a first memory device 204, and a second memory device 206. The first memory device 204 and the second memory device 206 may be volatile memory devices. For example, the first memory device 204 and the second memory device 206 may be dynamic random access memory (DRAM) devices. The memory controller 202 may be coupled to the memory devices 204, 206 via a command bus 208 and via a sideband channel 210 (e.g., a single sideband channel). In a particular embodiment, the system 200 may also include a data bus (not shown).

The first memory device 204 may include a first plurality of memory cells 234 that store data. In a particular embodiment, the first plurality of memory cells 234 may correspond to DRAM cells. The first plurality of memory cells 234 may operate in a substantially similar manner as the first plurality of memory cells 134 of FIG. 1. For example, each memory cell in the first plurality of memory cells 234 may be refreshed, or re-energized, at a particular refresh rate in order to maintain data integrity.

The first memory device 204 also includes a first temperature sensor 228. The first temperature sensor 228 may monitor a first temperature of the first memory device 204. The first memory device 204 also includes a first timer 230 that is configured to generate first pulses at a first rate based on the first temperature. For example, the first rate may increase as the first temperature of the first memory device 204 increases. The first rate may correspond to an amount of time the first plurality of memory cells 234 may maintain data integrity without being recharged (e.g., refreshed). Thus, the first rate may be associated with a refresh rate of the first plurality of memory cells 234. The first timer 230 may transmit the first pulses to the memory controller 202 over the sideband channel 210 at the first rate.

The second memory device 206 includes a second plurality of memory cells 254, a second timer 250, and a second temperature sensor 248. The second plurality of memory cells 254, the second timer 250, and the second temperature sensor 248 may operate in a substantially similar manner with respect to the second memory device 206 as described with respect to the first plurality of memory cells 234, the first timer 230, and the first temperature sensor 228, respectively. The second timer 250 may be configured to generate second pulses at a second rate based on a second temperature of the second memory device 206. The second rate may correspond to an amount of time the second plurality of memory cells 254 may maintain data integrity without being recharged (e.g., refreshed). The second timer 250 may transmit the second pulses to the memory controller 202 over the sideband channel 210 at the second rate.

In a particular embodiment, the first memory device 204 and the second memory device 206 may be within a common rank of the system 200 and may be accessed in "lockstep." For example, the memory devices 204, 206 may undergo read operations at a common time and may be refreshed at a common time.

The memory controller 202 may be configured to detect the first rate of the first pulses over the sideband channel 210 and to detect the second rate of the second pulses over the sideband channel 210. For example, the memory controller 202 may deactivate (e.g., power down) the second memory device 206 to isolate the first memory device 204. By isolating the first memory device 204, the memory controller 202 may detect the first rate of the first pulses and may record the first rate. The memory controller 202 may reactivate (e.g., power up) the second memory device 206 and deactivate the first memory device 204 to isolate the second memory device 206. By isolating the second memory device 206, the memory controller 202 may detect the second rate of the second pulses and may record the second rate.

The memory controller 202 may include a command scheduler 214 that is configured to generate refresh commands at the first rate or the second rate and to transmit the refresh commands to the memory devices 204, 206 via the command bus 208. For example, the memory controller 202 may be configured to determine whether the first rate is greater than the second rate. In response to a determination that the first rate is greater than the second rate (e.g., the second memory device 206 is the slave device and the first memory device 204 is the master device), the command scheduler 214 may generate and transmit the refresh commands at the first rate. In response to a determination that the first rate is not greater than the second rate (e.g., the second memory device 206 is the master device and the first memory device 204 is the slave device), the command scheduler 214 may generate and transmit the refresh commands at the second rate.

A first command decoder 226 of the first memory device 204 may be configured to receive the refresh commands from the command scheduler 214, and a second command decoder 246 of the second memory device 206 may be configured to receive the refresh commands from the command scheduler 214. The first and second command decoders 226, 246 may decode the refresh commands and provide the decoded refresh commands to a first and second refresh circuit 232, 252, respectively. The first refresh circuit 232 generates a voltage signal to charge capacitors of the first plurality of memory cells 234 in response to receiving the decoded refresh command, and the second refresh circuit 252 generates a voltage signal to charge capacitors of the second plurality of memory cells 254 in response to receiving the decoded refresh commands. Charging the capacitors refreshes the memory cells 234, 254 to maintain data integrity.

The system 200 of FIG. 1 may incorporate benefits of a self-refresh memory operation with benefits of an auto-refresh operation. For example, the system 200 may improve data throughput at the memory devices 204, 206 by initiating the refresh process at the memory controller 202 to maintain operation of the first memory device 204 and the second memory device 206 in lockstep.

Figure 3:
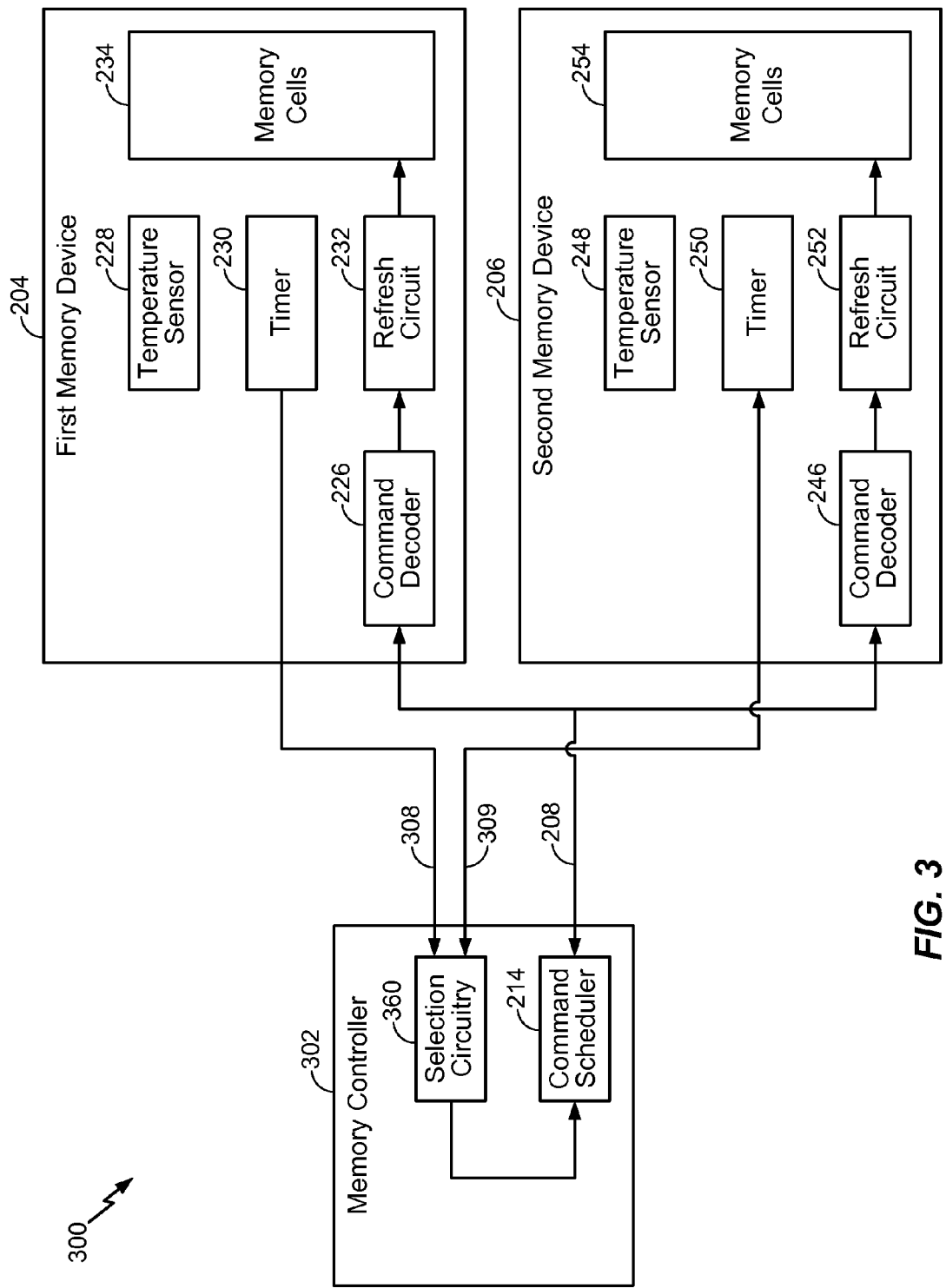
FIG. 3 is a block diagram to illustrate another particular embodiment of a system that is operable to refresh a memory cell.

Referring to FIG. 3, another particular embodiment of a system 300 that is operable to refresh a memory cell is shown. The system 300 includes the memory controller 202, the first memory device 204, and the second memory device 206.

In the illustrated embodiment, the memory controller 202 includes selection circuitry 360 that is coupled to a first sideband channel 308 and to a second sideband channel 309 (e.g., two distinct sideband channels). The first pulses are communicated from the first timer 230 to the selection circuitry 360 at the first rate via the first sideband channel 308. The second pulses are communicated from the second timer 250 to the selection circuitry 360 at the second rate via the second sideband channel 309.

The selection circuitry 360 may be configured to simultaneously detect the first pulses at the first rate and the second pulses at the second rate. In response to detecting the first pulses and the second pulses, the selection circuitry 360 may determine whether the first rate is greater than the second rate. In response to a determination that the first rate is greater than the second rate, the command scheduler 214 may generate and transmit the refresh commands at the first rate. In response to a determination that the first rate is not greater than the second rate, the command scheduler 214 may generate and transmit the refresh commands at the second rate.

The system 300 of FIG. 3 may receive and process DRAM internal refresh beats (e.g., the first pulses and the second pulses) simultaneously, thus foregoing the deactivation process described with respect to FIG. 2. Foregoing the deactivation processes may improve overall memory performance and conserve energy that may otherwise be used to deactivate and reactivate the memory devices 204, 206. The selection circuitry 360 may also periodically check whether the first rate is greater than the second rate without having to deactivate the memory devices 204, 206. For example, if the first rate and/or the second rate change by an amount sufficient to cause a memory device to transition from being a slave device to being a master device, the memory controller 202 may change the rate at which the refresh commands are sent based on the pulses of the new master device without having to power down the memory devices 204, 206.

Although the systems 100-300 illustrated in FIGS. 1-3 show two memory devices, in other embodiments, the systems 100-300 may include additional memory devices in lockstep. As a non-limiting example, one or more of the systems 100-300 may include eight memory devices in lockstep.

Figure 4:
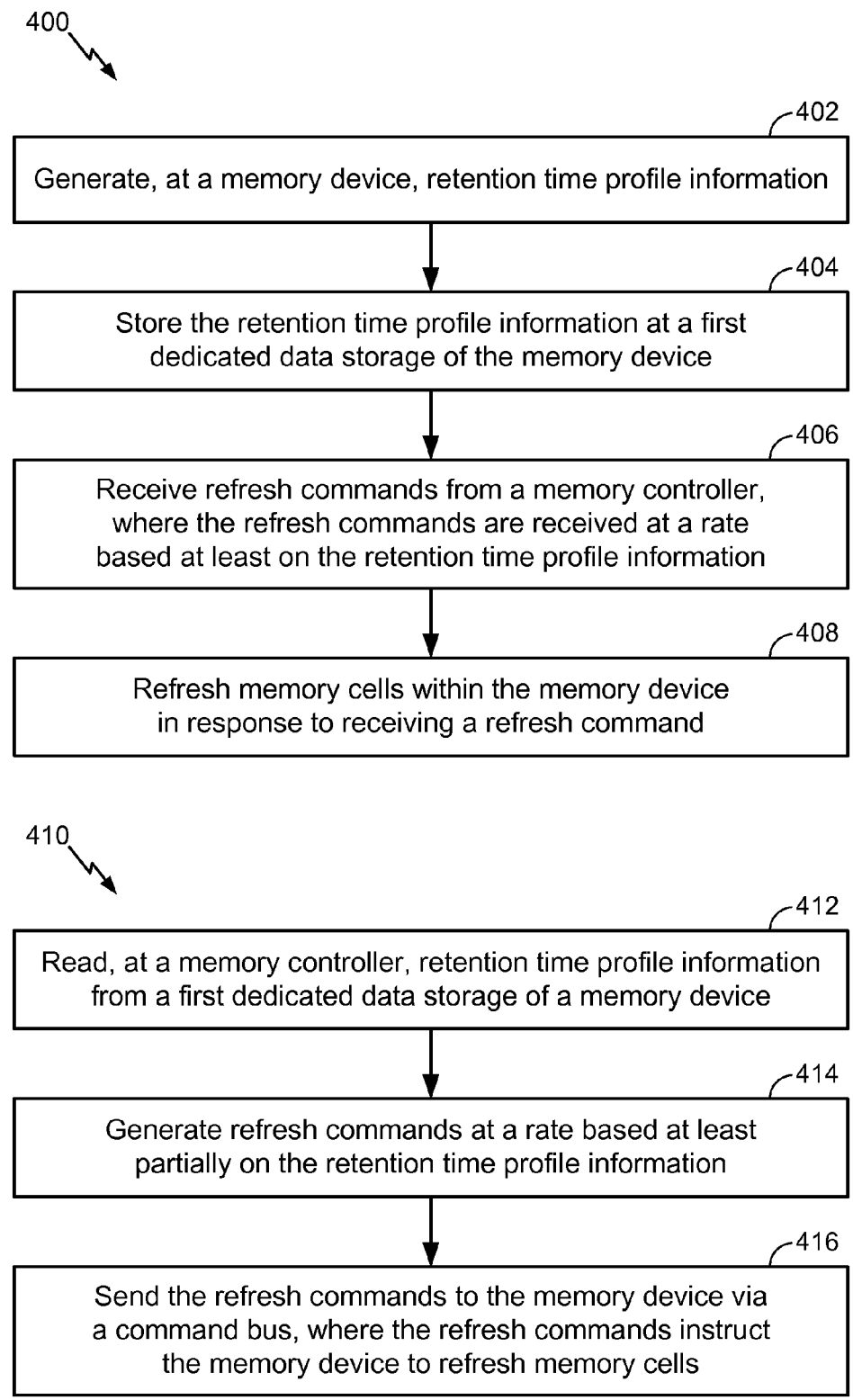
FIG. 4 is a flowchart to illustrate particular embodiments of methods for refreshing a memory cell.

Referring to FIG. 4, flowcharts to illustrate particular embodiments of methods for refreshing a memory cell is shown. A first method 400 of FIG. 4 may be performed by a memory device, such as the memory devices 104, 106 of FIG. 1. A second method 410 of FIG. 4 may be performed by a memory controller, such as the memory controller 102 of FIG. 1.

The first method 400 may include generating retention time profile information at a memory device, at 402. For example, in FIG. 1, the first timer 130 may generate first retention time profile information of the first memory device 104. The first retention time profile information may include data that indicates a first retention time of the first plurality of memory cells 134. For example, the first retention time profile information may include data that corresponds to an amount of time the first plurality of memory cells 134 may maintain data integrity without being recharged (e.g., refreshed). In other embodiments, retention time profile information may be hard-coded at memory devices, such as in the first mode register 122 of FIG. 1. For example, the retention time profile information may indicate a retention time of memory cells at a particular temperature within a memory device.

The retention time profile information may be stored at a first dedicated data storage of the memory device, at 404. For example, in FIG. 1, the first mode register 122 may store the first retention time profile information. Refresh commands may be received from a memory controller, at 406. For example, in FIG. 1, the first command decoder 126 may receive the refresh commands from the command scheduler 114. The refresh commands may be received at a rate based at least partially on the first retention time profile information if the first retention time is less than the second retention time or based on the second retention time profile information if the second retention time is less than the first retention time.

Memory cells within the memory device may be refreshed in response to receiving a refresh command, at 408. For example, in FIG. 1, the first command decoder 126 may decode the refresh commands and provide the decoded refresh commands to the first refresh circuit 132. The first refresh circuit 132 may generate a voltage signal to charge capacitors of the first plurality of memory cells 134 in response to receiving the decoded refresh command. Charging the capacitors refreshes the memory cells 134 to maintain data integrity.

The second method 410 includes reading, at a memory controller, retention profile information from a first dedicated data storage of a memory device, at 412. For example, in FIG. 1, the memory controller 102 may read the first retention time profile information from the first mode register 122 and the second retention time profile information from the third mode register 142. The memory controller 102 may read the first and second retention time profile information and the first and second temperature information using a mode register read (MRR) command.

Refresh commands may be generated at a rate at least partially based on the retention time profile information, at 414. For example, in FIG. 1, the decision logic 113 may determine which memory device 104, 106 is the master device (e.g., has the shortest retention time associated with the memory cells 134, 154) based on the retention time profile information and the temperature information. The memory controller 102 may modify (e.g., adjust) the refresh timer 112 based on the retention time profile information associated with the master device. For example, the refresh timer 112 may send a signal to the command scheduler 114 to generate a refresh command at a particular rate. If the first memory device 104 is the master device, the memory controller 102 may modify the refresh timer 112 to send the signal to the command scheduler 114 at a rate associated with the first retention time. If the second memory device 106 is the master device, the memory controller 102 may modify the refresh timer 112 to send the signal to the command scheduler 114 at a rate associated with the second retention time. The command scheduler 114 may generate refresh commands at the particular rate based on the retention time profile information.

The refresh commands may be sent to the memory device via a command bus, at 416. For example, in FIG. 1, the command scheduler 114 may transmit the refresh commands to the memory devices 104, 106 via the command bus 110. The memory devices 104, 106 may refresh the memory cells 134, 154 in response to receiving a refresh command.

The methods 400, 410 of FIG. 4 may incorporate benefits of a self-refresh memory operation with benefits of an auto-refresh operation. For example, the methods 400, 410 may improve data throughput at the memory devices 104, 106 by initiating the refresh process at the memory controller 102 (e.g., at the refresh timer 112) to maintain operation of the first memory device 104 and the second memory device 106 in lockstep. The methods 400, 410 may also utilize the temperature sensors 128, 148 located on the memory devices 104, 106 to determine a retention time of the memory cells 134, 154. Thus, the retention time may be based on specific characteristics (e.g., temperatures and retention time profile information) of the memory devices 134, 154 and may be longer than a standardized retention time, such as specified by a JEDEC standard. For example, under typical operating temperatures (e.g., approximately 85 degrees Celsius), the methods 400, 410 may reduce an amount of power consumption at the memory devices 104, 106 by approximately fifty percent when compared to a conventional auto-refresh memory operation. Under relatively low operating temperatures (e.g., approximately 25 degrees Celsius), the methods 400, 410 may reduce an amount of power consumption at the memory devices 104, 106 by approximately eighty percent when compared to a conventional auto-refresh memory operation.

Figure 5:
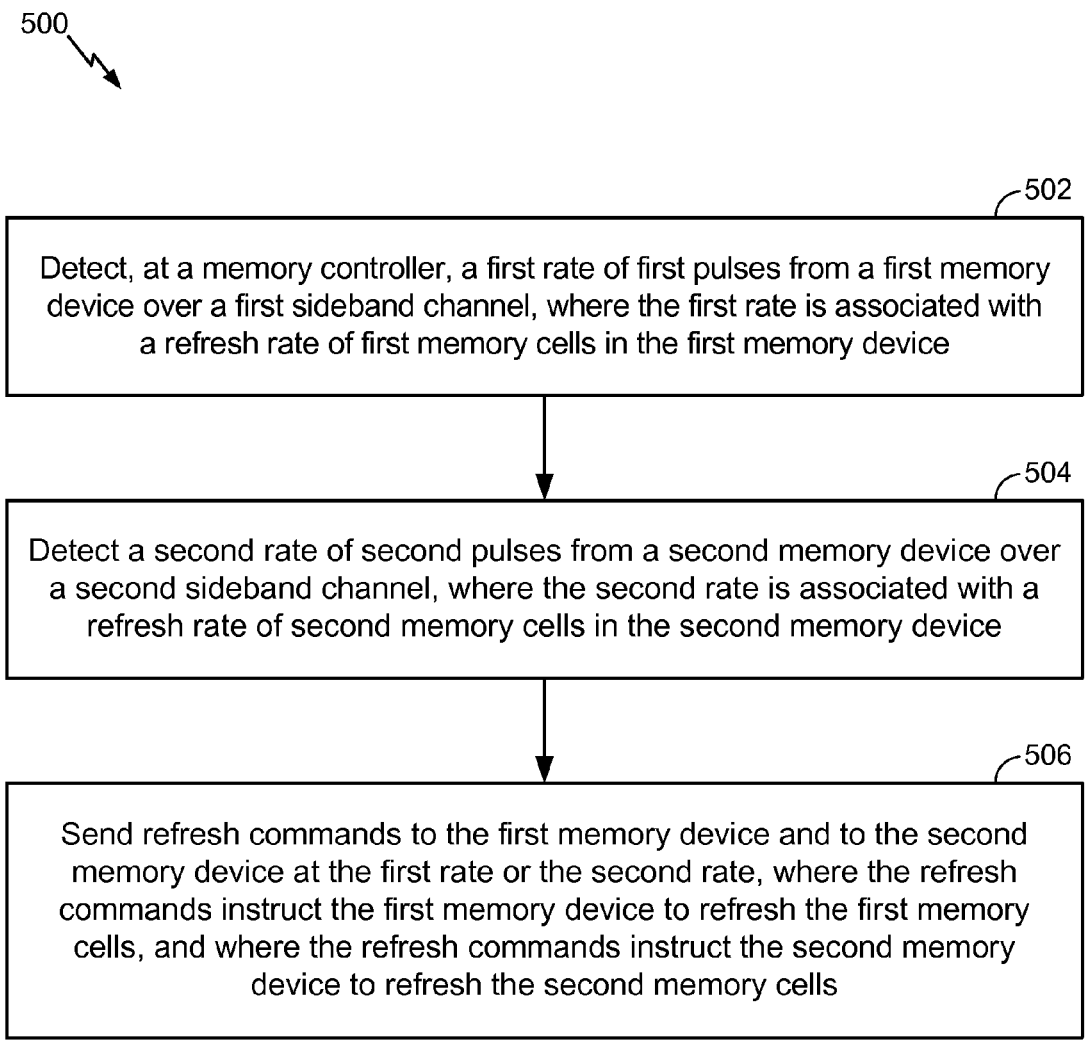
FIG. 5 is a flowchart to illustrate another particular embodiment of a method for refreshing a memory cell.

Referring to FIG. 5, a flowchart to illustrate another particular embodiment of a method 500 for refreshing a memory cell is shown. The method 500 may be performed by a memory controller, such as the memory controller 202 of FIGS. 2-3.

The method 500 includes detecting, at a memory controller, a first rate of first pulses from a first memory device over a first sideband channel, at 502. For example, in FIG. 2, the memory controller 202 may detect the first rate of the first pulses from the first memory device 204 over the sideband channel 210. The memory controller 202 may deactivate (e.g., power down) the second memory device 206 to isolate the first memory device 204. By isolating the first memory device 204, the memory controller 202 may detect the first rate of the first pulses and may record the first rate. The first rate may be associated with a refresh rate of the first plurality of memory cells 234 in the first memory device 204. As another example, in FIG. 3, the selection circuitry 360 may simultaneously detect the first pulses at the first rate and the second pulses at the second rate. The selection circuitry 360 may detect the first pulses using the first sideband channel 308.

A second rate of second pulses may be detected from a second memory device over a second sideband channel, at 504. For example, in FIG. 2, the memory controller 202 may detect the second rate of the second pulses over the sideband channel 210. The memory controller 202 may reactivate (e.g., power up) the second memory device 206 and deactivate the first memory device 204 to isolate the second memory device 206. By isolating the second memory device 206, the memory controller 202 may detect the second rate of the second pulses and may record the second rate. As another example, in FIG. 3, the selection circuitry 360 may simultaneously detect the first pulses at the first rate and the second pulses at the second rate. The selection circuitry 360 may detect the second pulses using the second sideband channel 309.

Refresh commands may be sent to the first memory device and to the second memory device at the first rate or the second rate, at 506. For example, in FIGS. 2-3, the command scheduler 214 may generate refresh commands at the first rate or the second rate and transmit the refresh commands to the memory devices 204, 206 via the command bus 208. The memory controller 202 may be configured to determine whether the first rate is greater than the second rate. In response to a determination that the first rate is greater than the second rate (e.g., the second memory device 106 is the slave device and the first memory device 104 is the master device), the command scheduler 214 may generate and transmit the refresh commands at the first rate. In response to a determination that the first rate is not greater than the second rate (e.g., the second memory device 106 is the master device and the first memory device 104 is the slave device), the command scheduler 214 may generate and transmit the refresh commands at the second rate. The refresh commands instruct the memory devices 204, 206 to refresh the memory cells 234, 254.

The method 500 of FIG. 5 may incorporate benefits of a self-refresh memory operation with benefits of an auto-refresh operation. For example, the method 500 may improve data throughput at the memory devices 204, 206 by initiating the refresh process at the memory controller 202 to maintain operation of the first memory device 204 and the second memory device 206 in lockstep.

In particular embodiments, the methods 400, 410, and/or 500 of FIGS. 4-5 may be implemented via hardware (e.g., a field-programmable gate array (FPGA) device, an application-specific integrated circuit (ASIC), etc.) of a processing unit, such as a central processing unit (CPU), a digital signal processor (DSP), or a controller, via a firmware device, or any combination thereof. As an example, the methods 400, 410, and/or 500 of FIGS. 4-5 can be performed by a processor that executes instructions. FIGS. 1-5 thus illustrate examples including systems and methods that refresh memory cells of a memory device.

Figure 6:
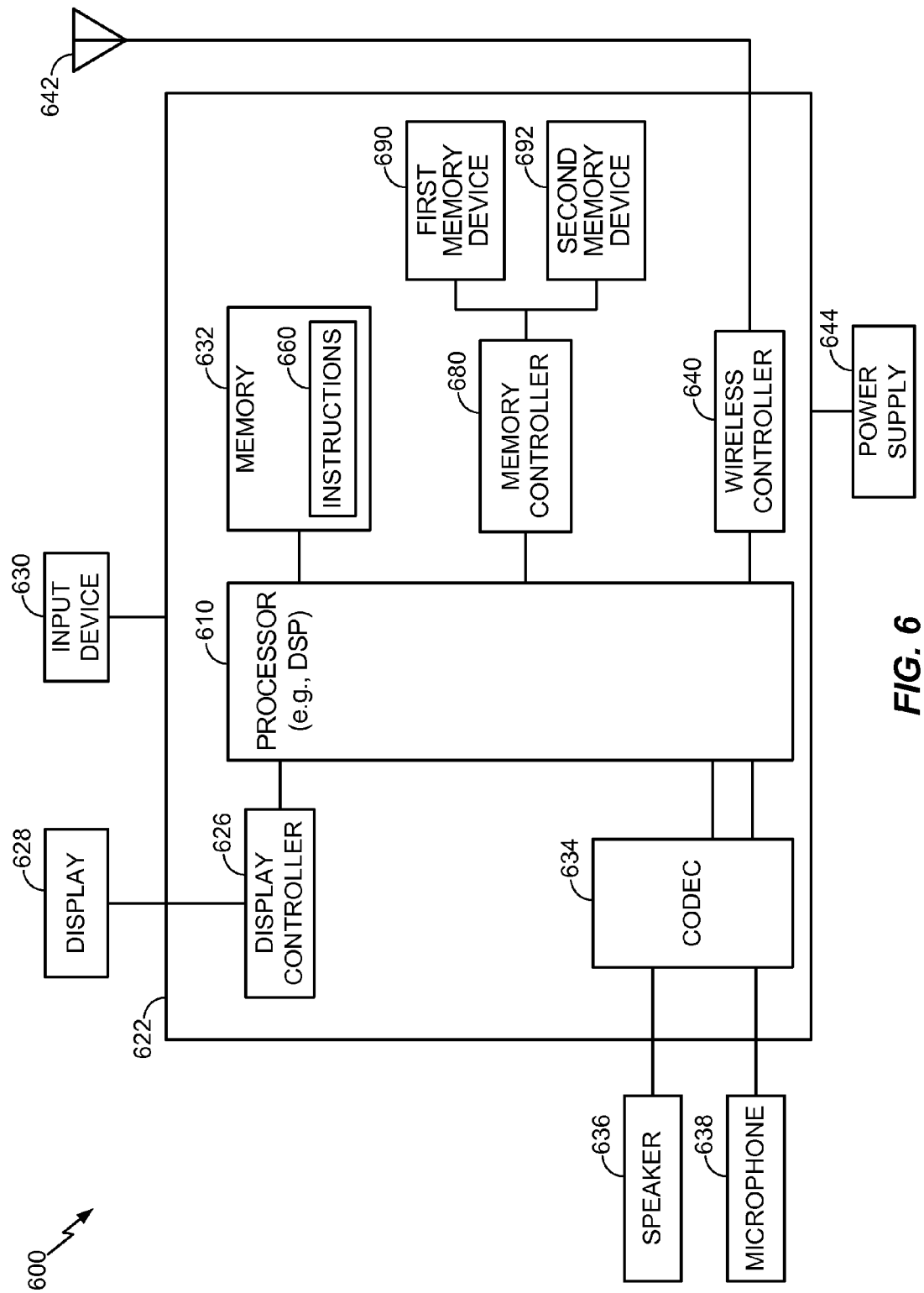
FIG. 6 is a block diagram of a wireless device operable to perform memory cell refreshing operations in accordance with the systems and methods of FIGS. 1-5.

Referring to FIG. 6, a block diagram of a particular illustrative embodiment of a wireless communication device is depicted and generally designated 600. The device 600 includes a processor 610 (e.g., a central processing unit (CPU), a digital signal processor (DSP), etc.) coupled to a memory 632. The memory 632 may include instructions 660 executable by the processor 610 and/or a memory controller 680 to perform methods and processes disclosed herein, such as the methods of FIGS. 4-5. In a particular embodiment, the memory controller 680 may correspond to one or more of the memory controllers 102, 202, or 302 of FIGS. 1-3.

The memory 632 may be a memory device, such as a random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). The memory device may include instructions (e.g., the instructions 660) that, when executed by a computer (e.g., the memory controller 680 and/or the processor 610), may cause the computer to perform at least a portion of the methods 400, 410 of FIG. 4 or at least a portion of the method 500 of FIG. 5. A first memory device 690 and a second memory device 692 may be coupled to the memory controller 680. In a particular embodiment, the first memory device 690 and the second memory device 692 may correspond to one or more of the first memory devices 104, 204, or 304 of FIGS. 1-3 and the second memory devices 106, 206, or 306 of FIGS. 1-3, respectively. Although two memory devices 690, 692 are illustrated, in other embodiments, additional memory devices may be coupled to the memory controller 680 in lockstep. As a non-limiting example, seven additional memory devices may be coupled to the memory controller 680. In a particular embodiment, the memory 632 may also be coupled to receive refresh commands from the memory controller 680.

FIG. 6 also shows a display controller 626 that is coupled to the processor 610 and to a display 628. An encoder/decoder (CODEC) 634 may be coupled to the processor 610, as shown. A speaker 636 and a microphone 638 can be coupled to the CODEC 634. FIG. 6 also shows a wireless controller 640 coupled to the processor 610 and to an antenna 642. In a particular embodiment, the processor 610, the display controller 626, the memory 632, the CODEC 634, and the wireless controller 640 are included in a system-in-package or system-on-chip device (e.g., a mobile station modem (MSM)) 622. In a particular embodiment, an input device 630, such as a touchscreen and/or keypad, and a power supply 644 are coupled to the system-on-chip device 622. Moreover, in a particular embodiment, as illustrated in FIG. 6, the display 628, the input device 630, the speaker 636, the microphone 638, the antenna 642, and the power supply 644 are external to the system-on-chip device 622. However, each of the display 628, the input device 630, the speaker 636, the microphone 638, the antenna 642, and the power supply 644 can be coupled to a component of the system-on-chip device 622, such as an interface or a controller.

In conjunction with the described embodiments, a first apparatus includes means for storing retention time profile information at a memory device. For example, the means for storing the retention time profile information may include the mode registers 122, 124, 142, 144 of FIG. 1, the memory devices 104, 106 of FIG. 1, the first memory device 690 of FIG. 7, the second memory device 692 of FIG. 6, one or more other devices, circuits, modules, or instructions to store retention time profile information, or any combination thereof.

The first apparatus may also include means for receiving refresh commands from a memory controller. For example, the means for receiving the refresh commands may include the command decoders 126, 146 of FIG. 1, the memory devices 104, 106 of FIG. 1, the memory devices 690, 692 of FIG. 6, one or more other devices, circuits, modules, or instructions to receive the refresh commands, or any combination thereof.

The first apparatus may also include means for refreshing memory cells within the memory device. For example, the means for refreshing the memory cells may include the memory devices 104, 106 of FIG. 1, the refresh circuits 132, 152 of FIG. 1, the memory devices 690, 692 of FIG. 6, one or more other devices, circuits, modules, or instructions to refresh the memory cells, or any combination thereof.

A second apparatus may include means for reading retention time profile information from a first dedicated data storage of a memory device. For example, the means for reading the retention time profile information may include the memory controller 102 of FIG. 1, the data bus 108 of FIG. 1, the decision logic circuitry 113 of FIG. 1, the memory controller 680 of FIG. 6, one or more other devices, circuits, modules, or instructions to read the retention time profile information, or any combination thereof.

The second apparatus may also include means for generating refresh commands at a rate based at least partially on the retention time profile information. For example, the means for generating the refresh commands may include the memory controller 102 of FIG. 1, the refresh timer 112 of FIG. 1, the command scheduler 114 of FIG. 1, the memory controller 680 of FIG. 6, one or more other devices, circuits, modules, or instructions to generate the refresh commands, or any combination thereof.

The second apparatus may also include means for sending the refresh commands to the memory device. For example, the means for sending the refresh commands may include the memory controller 102 of FIG. 1, the command scheduler 114 of FIG. 1, the command bus 110 of FIG. 1, the memory controller 680 of FIG. 6, one or more other devices, circuits, modules, or instructions to send the refresh commands, or any combination thereof.

A third apparatus may include means for detecting a first rate of first pulses from a first memory device. For example, the means for detecting the first rate may include the memory controller 202 of FIGS. 2-3, the selection circuitry 360 of FIG. 3, the sideband channel 210 of FIG. 2, the first sideband channel 308 of FIG. 3, the memory controller 680 of FIG. 6, one or more other devices, circuits, modules, or instructions to detect the first rate, or any combination thereof.

The third apparatus may also include means for detecting a second rate of second pulses from a second memory device. For example, the means for detecting the second rate may include the memory controller 202 of FIGS. 2-3, the selection circuitry 360 of FIG. 3, the sideband channel 210 of FIG. 2, the second sideband channel 309 of FIG. 3, the memory controller 680 of FIG. 6, one or more other devices, circuits, modules, or instructions to detect the second rate, or any combination thereof.

The third apparatus may also include means for sending refresh commands to the first memory device and to the second memory device at the first rate or at the second rate. For example, the means for sending the refresh commands may include the memory controller 202 of FIGS. 2-3, the command scheduler 214 of FIGS. 2-3, the command bus 208 of FIGS. 2-3, the memory controller 680 of FIG. 6, one or more other devices, circuits, modules, or instructions to send the refresh command, or any combination thereof.

Figure 7:
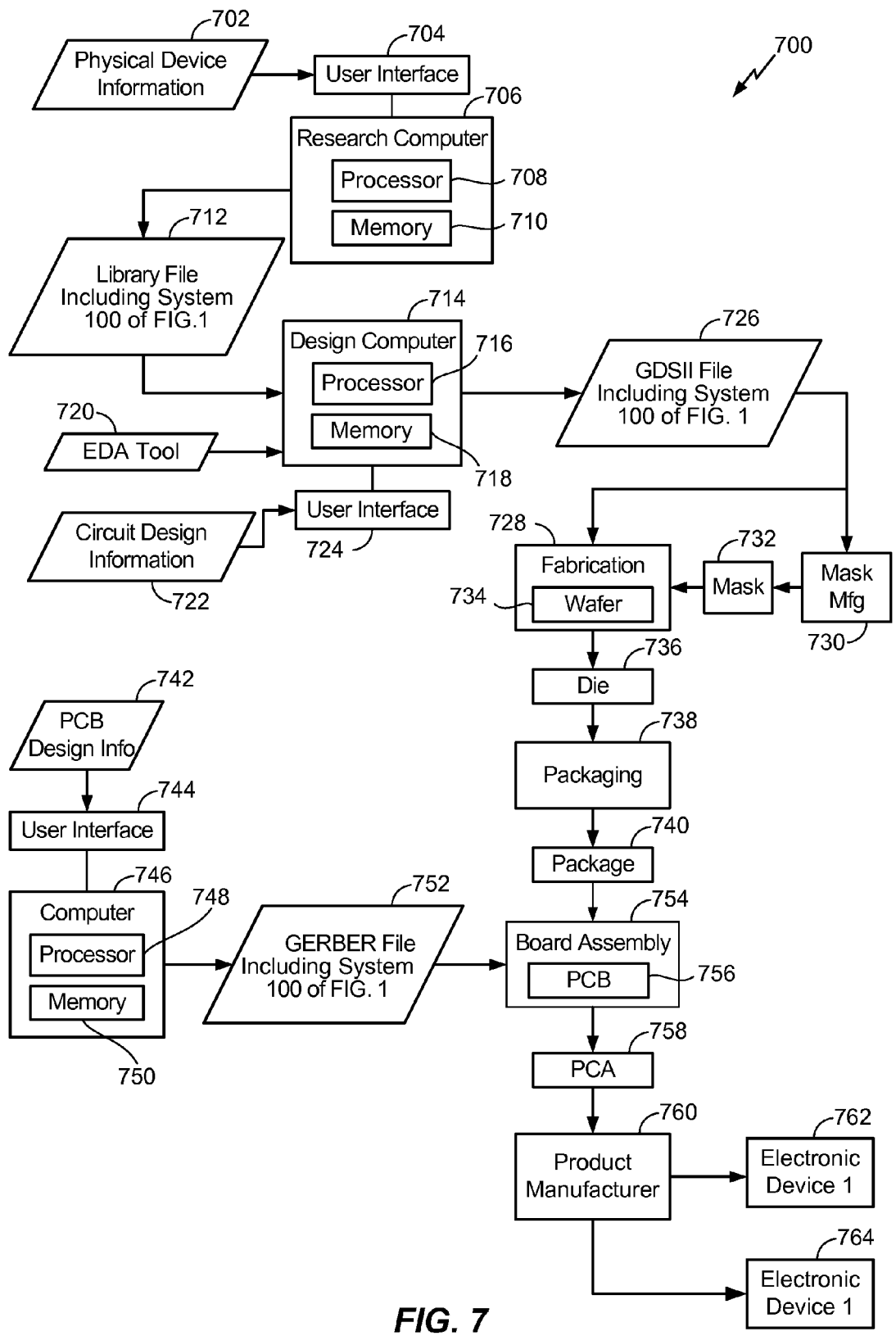
FIG. 7 is a data flow diagram of a particular illustrative embodiment of a manufacturing process to manufacture electronic devices that include a component operable to refresh a memory cell.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices, such as a communications device (e.g., a mobile phone), a tablet, a laptop, a personal digital assistant (PDA), a set top box, a music player, a video player, an entertainment unit, a navigation device, a fixed location data unit, or a computer. FIG. 7 depicts a particular illustrative embodiment of an electronic device manufacturing process 700.

Physical device information 702 is received at the manufacturing process 700, such as at a research computer 706. The physical device information 702 may include design information representing at least one physical property of a semiconductor device, such as a device that includes the systems 100-300 of FIGS. 1-3, or any combination thereof. For example, the physical device information 702 may include physical parameters, material characteristics, and structure information that is entered via a user interface 704 coupled to the research computer 706. The research computer 706 includes a processor 708, such as one or more processing cores, coupled to a computer readable medium such as a memory 710. The memory 710 may store computer readable instructions that are executable to cause the processor 708 to transform the physical device information 702 to comply with a file format and to generate a library file 712.

In a particular embodiment, the library file 712 includes at least one data file including the transformed design information. For example, the library file 712 may include a library of semiconductor devices including the systems 100-300 of FIGS. 1-3, or any combination thereof, that is provided for use with an electronic design automation (EDA) tool 720.

The library file 712 may be used in conjunction with the EDA tool 720 at a design computer 714 including a processor 716, such as one or more processing cores, coupled to a memory 718. The EDA tool 720 may be stored as processor executable instructions at the memory 718 to enable a user of the design computer 714 to design a device that includes the systems 100-300 of FIGS. 1-3, or any combination thereof, of the library file 712. For example, a user of the design computer 714 may enter circuit design information 722 via a user interface 724 coupled to the design computer 714. The circuit design information 722 may include design information representing at least one physical property of a semiconductor device that includes the systems 100-300 of FIGS. 1-3, or any combination thereof. To illustrate, the circuit design property may include identification of particular circuits and relationships to other elements in a circuit design, positioning information, feature size information, interconnection information, or other information representing a physical property of a semiconductor device.

The design computer 714 may be configured to transform the design information, including the circuit design information 722, to comply with a file format. To illustrate, the file formation may include a database binary file format representing planar geometric shapes, text labels, and other information about a circuit layout in a hierarchical format, such as a Graphic Data System (GDSII) file format. The design computer 714 may be configured to generate a data file including the transformed design information, such as a GDSII file 726 that includes information describing a device that includes the systems 100-300 of FIGS. 1-3, or any combination thereof. To illustrate, the data file may include information corresponding to a system-on-chip (SOC) that includes the systems 100-300 of FIGS. 1-3, or any combination thereof, and that also includes additional electronic circuits and components within the SOC.

The GDSII file 726 may be received at a fabrication process 728 to manufacture a semiconductor device that includes the systems 100-300 of FIGS. 1-3, or any combination thereof, according to transformed information in the GDSII file 726. For example, a device manufacture process may include providing the GDSII file 726 to a mask manufacturer 730 to create one or more masks, such as masks to be used with photolithography processing, illustrated as a representative mask 732. The mask 732 may be used during the fabrication process to generate one or more wafers 734, which may be tested and separated into dies, such as a representative die 736. The die 736 includes a circuit including the systems 100-300 of FIGS. 1-3, or any combination thereof.

The die 736 may be provided to a packaging process 738 where the die 736 is incorporated into a representative package 740. For example, the package 740 may include the single die 736 or multiple dies, such as a system-in-package (SiP) arrangement. The package 740 may be configured to conform to one or more standards or specifications, such as Joint Electron Device Engineering Council (JEDEC) standards.

Information regarding the package 740 may be distributed to various product designers, such as via a component library stored at a computer 746. The computer 746 may include a processor 748, such as one or more processing cores, coupled to a memory 750. A printed circuit board (PCB) tool may be stored as processor executable instructions at the memory 750 to process PCB design information 742 received from a user of the computer 746 via a user interface 744. The PCB design information 742 may include physical positioning information of a packaged semiconductor device on a circuit board, the packaged semiconductor device corresponding to the package 740 including the a device that includes the systems 100-300 of FIGS. 1-3, or any combination thereof.

The computer 746 may be configured to transform the PCB design information 742 to generate a data file, such as a GERBER file 752 with data that includes physical positioning information of a packaged semiconductor device on a circuit board, as well as layout of electrical connections such as traces and vias, where the packaged semiconductor device corresponds to the package 740 including the systems 100-300 of FIGS. 1-3, or any combination thereof. In other embodiments, the data file generated by the transformed PCB design information may have a format other than a GERBER format.

The GERBER file 752 may be received at a board assembly process 754 and used to create PCBs, such as a representative PCB 756, manufactured in accordance with the design information stored within the GERBER file 752. For example, the GERBER file 752 may be uploaded to one or more machines to perform various steps of a PCB production process. The PCB 756 may be populated with electronic components including the package 740 to form a representative printed circuit assembly (PCA) 758.

The PCA 758 may be received at a product manufacture process 760 and integrated into one or more electronic devices, such as a first representative electronic device 762 and a second representative electronic device 764. As an illustrative, non-limiting example, the first representative electronic device 762, the second representative electronic device 764, or both, may be selected from the group of a communications device (e.g., a mobile phone), a tablet, a laptop, a personal digital assistant (PDA), a set top box, a music player, a video player, an entertainment unit, a navigation device, a fixed location data unit, and a computer, into which the systems 100-300 of FIGS. 1-3, or any combination thereof is integrated. As another illustrative, non-limiting example, one or more of the electronic devices 762 and 764 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. In addition to remote units according to teachings of the disclosure, embodiments of the disclosure may be suitably employed in any device which includes active integrated circuitry including memory and on-chip circuitry.

A device that includes the systems 100-300 of FIGS. 1-3, or any combination thereof, may be fabricated, processed, and incorporated into an electronic device, as described in the illustrative process 700. One or more aspects of the embodiments disclosed with respect to FIGS. 1-6 may be included at various processing stages, such as within the library file 712, the GDSII file 726, and the GERBER file 752, as well as stored at the memory 710 of the research computer 706, the memory 718 of the design computer 714, the memory 750 of the computer 746, the memory of one or more other computers or processors (not shown) used at the various stages, such as at the board assembly process 754, and also incorporated into one or more other physical embodiments such as the mask 732, the die 736, the package 740, the PCA 758, other products such as prototype circuits or devices (not shown), or any combination thereof. Although various representative stages of production from a physical device design to a final product are depicted, in other embodiments fewer stages may be used or additional stages may be included. Similarly, the process 700 may be performed by a single entity or by one or more entities performing various stages of the process 700.

Those of skill would further appreciate that the various illustrative logical blocks, configurations, modules, circuits, and algorithm steps described in connection with the embodiments disclosed herein may be implemented as electronic hardware, computer software executed by a processing device such as a hardware processor, or combinations of both. Various illustrative components, blocks, configurations, modules, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in a memory device, such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). An exemplary memory device is coupled to the processor such that the processor can read information from, and write information to, the memory device. In the alternative, the memory device may be integral to the processor. The processor and the storage medium may reside in an application-specific integrated circuit (ASIC). The ASIC may reside in a computing device or a user terminal. In the alternative, the processor and the storage medium may reside as discrete components in a computing device or a user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
  a first memory device configured to store first a retention time profile information, the first retention time profile information comprising data that indicates a first retention time of first memory cells within the first memory device at a first temperature and a second retention time of the first memory cells at a second temperature, wherein the first retention time is distinct from the second retention time, wherein the first retention time is associated with operation of the first memory cells at the first temperature, the first temperature distinct from the second temperature, wherein the second retention time is associated with operation of the first memory cells at the second temperature, and wherein the first retention time profile information is accessible to a memory controller via a data bus; and
  a second memory device configured to store a second retention time profile information, wherein the second retention time profile information comprises second data that indicates a third retention time of second memory cells within the second memory device, wherein the third retention time is associated with operation of the second memory cells at the first temperature, wherein the third retention time is distinct from the first retention time, wherein the first memory device and the second memory device are configured to receive refresh commands from the memory controller, and wherein a rate of the refresh commands is based on a lower of the first retention time and the third retention time.

2. The apparatus of claim 1, wherein each of the first memory device and the second memory device comprises a dynamic random access memory (DRAM) device.

3. The apparatus of claim 1, wherein the first memory device includes a first mode register configured to store the first retention time profile information, and wherein the second memory device includes a second mode register configured to store the second retention time profile information.

4. The apparatus of claim 3, wherein the first memory device includes:
  a first temperature sensor configured to determine the first temperature of the first memory device; and
  a third mode register configured to store temperature data indicative of the first temperature.

5. The apparatus of claim 4, wherein the second memory device includes:
  a second temperature sensor configured to determine the second temperature of the second memory device; and
  a fourth mode register configured to store second temperature data indicative of the second temperature.

* * * * *